United States Patent [19]

Welland

[11] Patent Number: 4,471,324

[45] Date of Patent: Sep. 11, 1984

[54] ALL NPN VARIABLY CONTROLLED AMPLIFIER

[75] Inventor: David R. Welland, Boston, Mass.

[73] Assignee: DBX, Inc., Newton, Mass.

[21] Appl. No.: 340,878

[22] Filed: Jan. 19, 1982

[51] Int. Cl.³ .............................................. H03G 3/30
[52] U.S. Cl. ................................... 330/282; 330/284; 330/86; 330/145
[58] Field of Search ................. 330/86, 145, 133, 134, 330/282, 284; 333/14; 307/492, 493; 328/145, 160

[56] References Cited

U.S. PATENT DOCUMENTS

| | | | |
|---|---|---|---|
| 3,676,789 | 7/1972 | Bray | 330/134 X |
| 3,700,918 | 10/1972 | Kawashima | 307/492 |
| 3,919,654 | 11/1975 | Toumani | 330/134 X |
| 4,053,846 | 10/1977 | Acker | 330/86 X |

FOREIGN PATENT DOCUMENTS

| | | | |
|---|---|---|---|
| 55-56711 | 4/1980 | Japan | 330/284 |
| 55-56712 | 4/1980 | Japan | 330/282 |
| 55-85115 | 6/1980 | Japan | 330/282 |
| 1036727 | 7/1966 | United Kingdom . | |
| 1082042 | 9/1967 | United Kingdom . | |
| 1286036 | 8/1972 | United Kingdom . | |
| 1317255 | 5/1973 | United Kingdom . | |
| 1322219 | 7/1973 | United Kingdom . | |
| 1342383 | 1/1974 | United Kingdom . | |

OTHER PUBLICATIONS

Corinth, "Low Frequency Instrumentation Amplifier with Logarithmic Steps of Amplification," *Funkschan*, No. 17, 1981.

*Primary Examiner*—James B. Mullins
*Attorney, Agent, or Firm*—Schiller & Pandiscio

[57] ABSTRACT

A signal gain controlled system comprises an operational amplifier including a feedback path between the input and output terminals of the amplifier. The system includes first variable impedance means for varying the output voltage at the output terminal of the amplifier in response to and as a function of the input current signal applied to the input terminal and a first control signal. A signal path coupled between the output terminal of the operational amplifier and the output terminal of the system includes second variable impedance means for varying the output current of the system in response to and as a function of (a) the output voltage at the output of the amplifier and (b) a second control signal. The signal gain of the system is a function of the ratio of the second and first control signals.

The preferred amplifier is the type having an input resistance and a feedback resistance, wherein at least one of the resistances includes a transistor which is biased to operate in its saturated region. The gain of the amplifier is a function of the control signal applied to the base of the saturated transistor.

The signal gain controlled system can be utilized with a level sensing detector to provide signal compression or expansion.

38 Claims, 5 Drawing Figures

ALL NPN VARIABLY CONTROLLED AMPLIFIER

The present invention relates generally to amplifiers and to analog signal multipliers utilizing such amplifiers, and more particularly to (1) an amplifier having a signal controlled voltage gain (i.e., attenuation or amplification), and (2) an analog signal multiplier utilizing such an amplifier and adapted (a) to operate with relatively low voltage power sources and (b) to be manufactured in integrated circuit form.

Many systems, especially those for processing audio and video signals, include circuits for controlling signal gain in response to an electrical command or control signal. Some of these systems are particularly useful in providing noise reduction by controlling signal gain. One type of signal gain controlled circuit of the type for reducing noise and which has been commercially successful includes the multiplier circuit of the type described and claimed in U.S. Pat. No. 3,714,462 issued to David E. Blackmer on Jan. 30, 1973, as well as those manufactured and licensed by DBX, Inc., a corporation of Mass., (for convenience the circuits being collectively, hereinafter referred to as the "DBX Multiplier Circuit"). The DBX Multiplier Circuit generally includes means for providing a first signal as a function of the logarithm of the input signal to the circuit, and means responsive to the first signal for providing an output signal as a function of the antilogarithm of the algebraic sum of the first signal and a control signal. The DBX Multiplier Circuit is "bipolar" meaning that the input signal can be of either or both positive and negative polarities. The "gain" provided by the circuit can be either amplification or attenuation.

With the advent of integrated circuits a need has arisen, particularly in the audio and video fields, for a low cost signal gain controlled system which can operate with a relatively low DC voltage source. For example, some of the currently available portable, stereo, audio tape recorders include one or more integrated circuits adapted to operate with a three volt DC battery source. At least one of these recorders will typically continue to operate with DC voltages as low as 1.6 volts DC. The batteries used to power the latter recorder will therefore have a sufficiently long service life. While the current, commercially available IC DBX Multiplier Circuit is effective in providing variable signal gain it usually must be powered by two sources, at least +8.0 volts DC and at least −4.0 volts, DC.

Accordingly, it is an object of the present invention to provide a signal gain controlled system which can operate with relatively low DC voltage sources.

Another object of the present invention is to provide an improved signal gain controlled system.

And another object of the present invention is to provide a signal gain control system easily manufactured in integrated circuit form.

Yet another object of the present invention is to provide a signal multiplier circuit comprising transistors of the NPN conductivity type.

Still another object of the present invention is to provide a bipolar signal multiplier circuit (i.e., capable of processing signals of both polarities) utilizing NPN transistors.

And yet another object of the present invention is to provide a signal multiplier circuit adapted to operate with a single, relatively low voltage power source such as those used with portable audio tape recorders of the type described above.

The foregoing as well as other objects achieved by the signal gain control system of the present invention are preferably accomplished by utilizing a novel amplifier having a controllable signal gain factor.

Accordingly, another object of the present invention is to provide an improved amplifier having a controllable signal gain factor.

All of the above and other objects of the present invention are achieved by (1) an improved signal gain controlled system for impressing a gain on an input signal, and (2) an improved amplifier, utilized in the preferred embodiment of the signal gain controlled system.

The signal gain controlled system comprises, in combination, an operational amplifier, a feedback path between an input terminal and the output terminal of the operational amplifier; first variable impedance means disposed in the feedback path for varying the output voltage at the output terminal of the operational amplifier in response to and as a function of (1) the input current signal applied to the input terminal, and (2) a first control signal. A signal path coupled between the output terminal of the operational amplifier and the output terminal of the system includes second variable impedance means for varying the output current at the output terminal of the system generated in response to and as a function of (a) the output voltage at the output terminal of the amplifier, and (b) a second control signal. The gain provided between the input and output currents is a function of the ratio of the second and first control signals.

Another aspect of the present invention is to provide an improved signal gain controlled system for impressing a system signal gain on an input signal. The system is of the type including input means for receiving the input signal and output means for providing the output signal responsively to the input signal. The system comprises, in combination: means for generating a first control signal; means responsive to the input signal and the first control signal for generating an intermediate signal; means for generating a second control signal; and means responsive to said intermediate signal and said second control signal for generating said output signal; wherein the system signal gain is a function of the ratio of the second control signal to the first control signal.

And another aspect of the present invention utilizes the signal gain controlled system as described above wherein at least one of the means for generating a control signal is responsive to and a function of one of the input and output signals so as to provide signal expansion or compression.

The preferred amplifier of the present invention is of the type having an input resistance and a feedback resistance, wherein at least one of the resistances includes a bipolar transistor. Means are provided for biasing the transistor so that it operates in its saturated region so as to function as a variable resistor. The voltage gain provided by the amplifier is a function of a control signal applied to the base of the transistor.

Other objects of the invention will in part be obvious and will in part appear hereinafter. The invention accordingly comprises the apparatus possessing the construction, combination of elements, and arrangement of parts which are exemplified in the following detailed disclosure and the scope of the application of which will be indicated in the claims.

For a fuller understanding of the nature and objects of the present invention, reference should be had to the following detailed description taken in connection with the accompanying drawings wherein.

In the drawings the same numerals are utilized to designate like or similar parts.

Figure 1:
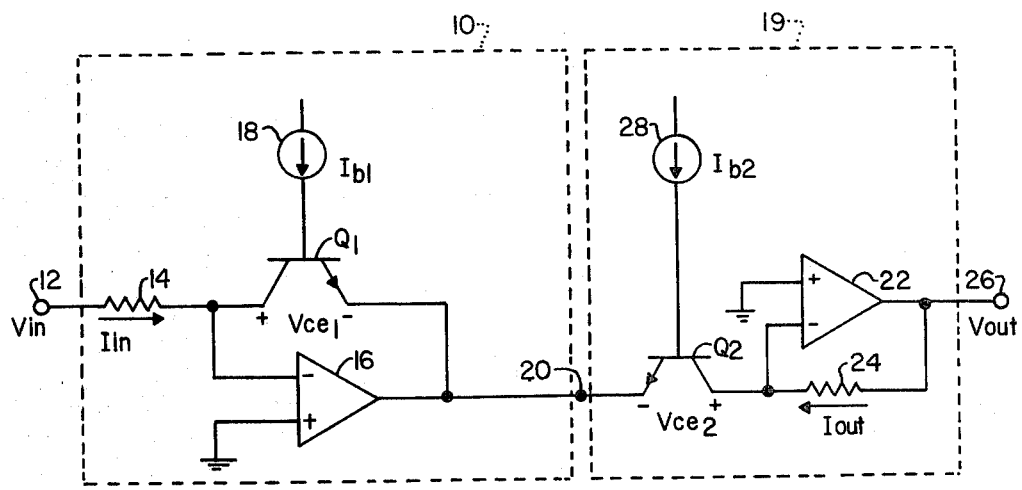
FIG. 1 shows a partial block and partial schematic diagram of one embodiment of the signal gain controlled system of the present invention.

In FIG. 1, the embodiment of the signal gain controlled system includes the operational amplifier stage 10 having its input terminal 12 adapted to receive an input voltage signal $V_{in}$ and connected through the input resistor 14 (for converting the input voltage to a current) to the inverting input terminal of operational amplifier 16. The noninverting input terminal of operational amplifier 16 is connected to system ground while the output and inverting input terminals are connected through transistor $Q_1$ to form a feedback path.

The transistor $Q_1$, preferably of an NPN conductivity type, has its collector connected to the inverting input terminal of amplifier 16 and its emitter connected to the output terminal of the amplifier. In accordance with the present invention the base is connected to receive a first control signal, in the form of control current $I_{b1}$, from current source 18 while the transistor $Q_1$ is biased to operate in the saturated region. The manner in which transistor $Q_1$ is biased is dependent upon the particular application of the system. One technique of biasing transistor $Q_1$ is described hereinafter with respect to FIGS. 3 and 5.

The saturated region of an NPN transistor is provided when the n-type materials (the collector and emitter of transistor $Q_1$ are each made of n-type materials) is provided with a potential more negative than the p-type material (the base of transistor $Q_1$). In other words both junctions are forward biased. This is in contrast to the forward active region wherein the base p-type material is at a potential more positive (forward biased junction) than the emitter n-type material and more negative (reversed biased junction) than the collector n-type material; the reverse active region wherein the base p-type material is at a potential more negative (reversed biased junction) than the emitter n-type material and more positive (forward biased junction) than the collector n-type material; and the cut-off region wherein the base p-type material is at a potential more negative than both the collector and emitter N-type materials (the latter situation occurs when both junctions are reversed biased). See Gray, Paul E. and Searle, Campbell L.; *Electronic Principles, Physics, Models, and Circuits;* John Wiley & Sons, Inc., N.Y. (1969); pp. 261, 262 and 770–781 for an explanation of active, saturated, and cutoff regions of transistors.

Transistor $Q_1$ will function as a variable resistor so long as the transistor operates in the saturated region. The actual conductance provided by transistor $Q_1$ is a linear function of the base current $I_{b1}$. The stage 10 therefore operates as an inverting amplifier stage having a voltage gain equal to $-(RQ_1/R_{14})$, wherein $RQ_1$ is the feedback resistance offered by transistor $Q_1$ and is a function of the base current $I_{b1}$, and $R_{14}$ is the input resistance offered by resistor 14.

The signal gain control system shown in FIG. 1 further includes an output stage 19. Stage 19 includes a second transistor $Q_2$ of the same conductivity type as transistor $Q_1$. Transistor $Q_2$ has identical structure and is therefore matched for its electrical transfer characteristics (including their current gains, i.e., forward and reversed betas, and their base-to-emitter voltage/collector current ($V_{be}/I_c$) transfer characteristics) to those of transistor $Q_1$. Transistor $Q_2$ is also biased (in any manner such as that described with reference to FIGS. 3 and 5 below) to operate in its saturated region so as to function as a variable resistor having a conductance linearly related to the base current $I_{b2}$. By matching transistors $Q_1$ and $Q_2$, the variable resistance of each transistor will vary in an identical manner with changes in the respective base current. Transistor $Q_2$ has its emitter connected to the junction 20 formed by the output of amplifier 16. The base of transistor $Q_2$ is connected to a current source 28 for providing the base current $I_{b2}$, and its collector connected to the inverting input of operational amplifier 22. The latter has its non-inverting input connected to system ground and its output connected (1) to a feedback path, through resistor 24 to its inverting input and (2) to the output terminal 26 of the device. It should be appreciated that stage 19 also functions as an inverting amplifier stage having a voltage gain equal to $-(R_{24}/RQ_2)$, wherein $R_{24}$ is the fixed feedback resistance offered by resistor 24, and $RQ_2$ is the variable input resistance which is a function of the base current $I_{b2}$.

Figure 2:
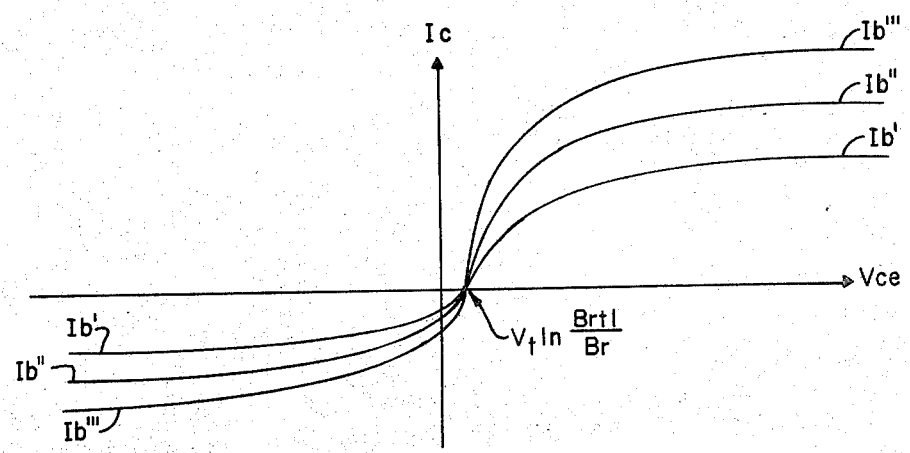
FIG. 2 illustrates typical common emitter curves of the transistor used in the present invention.

In operation the specific collector to emitter voltage ($V_{ce}$) vs collector current ($I_c$) of each transistor $Q_1$ and $Q_2$ is a function of the amplitude level of the base current ($I_b$). This is illustrated by the graphical representation shown in FIG. 2, wherein each curve is the approximate theoretical relationship between the collector to emitter voltage ($V_{ce}$) and collector current ($I_c$) for a particular value of base current $I_b$ (arbitrary values $I_b = I_b'$, $I_b''$, $I_b'''$ being shown). Each curve for a particular base current does not exhibit a linear relationship between $V_{ce}$ and $I_c$. Accordingly, the transfer function of each stage 10 and 19 is nonlinear. However, as will be more evident hereinafter, when the two stages operate together these nonlinear characteristics will complement one another so as to provide a linear system. In other words each curve is similar, in a geometric sense (i.e., same shape, different scale), to every other curve.

In operation the respective transistors $Q_1$ and $Q_2$ are biased into their saturated regions by (1) setting the D.C. collector currents of transistors $Q_1$ and $Q_2$ to zero (in a manner described hereinafter), and (2) applying the control currents $I_{b1}$ and $I_{b2}$, positive currents, to the respective bases of transistors $Q_1$ and $Q_2$, "positive" meaning that the currents flow into the bases. $V_{in}$, which can be an audio signal, can then be applied to input terminal 12. When the input voltage signal $V_{in}$ at input terminal 12 is of a positive polarity the input current $I_{in}$ to amplifier stage 10 is positive. Amplifier 16 causes a drop in the voltage at junction 20 of the common emitters of transistors $Q_1$ and $Q_2$. This results in an increase in $V_{ce1}$ sufficient to equate the collector current $I_c$, with the input current at the inverting input of amplifier 16. As previously described and as evident from the graph of FIG. 2, the value of $V_{ce}$ is dependent upon the value of $I_{b1}$.

The drop in voltage at junction 20 also sets the voltage on the emitter of transistor $Q_2$. While the emitter and collector of transistor $Q_2$ is more negative than its base, the drop in voltage on its emitter results in the collector of transistor $Q_2$ being more positive than its emitter. $V_{ce2}$, the collector to emitter voltage of transistor $Q_2$, therefore increases. The collector to emitter voltages across transistors $Q_1$ and $Q_2$ actually will theoretically always be equal. An increase in $V_{ce2}$ increases the collector current $I_{c2}$ of transistor $Q_2$. The value of $I_{c2}$ of transistor $Q_2$ is determined by the setting of the base current of $I_{b2}$.

It should be appreciated that as the input voltage $V_{in}$ increases and the input current through resistor 24 increases, the operation of transistors $Q_1$ and $Q_2$ will approach the operating point where the base to collector junctions of transistors $Q_1$ and $Q_2$ will become reversed biased so that the transistors begin operating in the forward active region of operation. At this operating point one is approaching the flat portion of the forward active region of the $V_{ce}/I_c$ common emitter curve.

When $V_{in}$ at terminal 12 is of a sufficiently low negative polarity the transistor $Q_1$ remains in the saturated region. A negative voltage at input terminal 12 results in a negative current $I_{in}$ to the inverting input of amplifier 16. Amplifier 16 causes a rise in the voltage at junction 20 of the common emitters of transistors $Q_1$ and $Q_2$. This results in a decrease in $V_{ce1}$ sufficient to equate the collector current $I_{c1}$ with the input current at the inverting input of amplifier 16. $V_{ce1}$, although negative, is still dependent upon the value of $I_{b1}$.

The rise in voltage at junction 20 also sets the voltage on the emitter of transistor $Q_2$. The collector-to-emitter voltages across transistors $Q_1$ and $Q_2$ will still, theoretically, be equal. The value of $I_{c2}$ of transistor $Q_2$ is still determined by the setting of the base current of $I_{b2}$.

Figure 3:
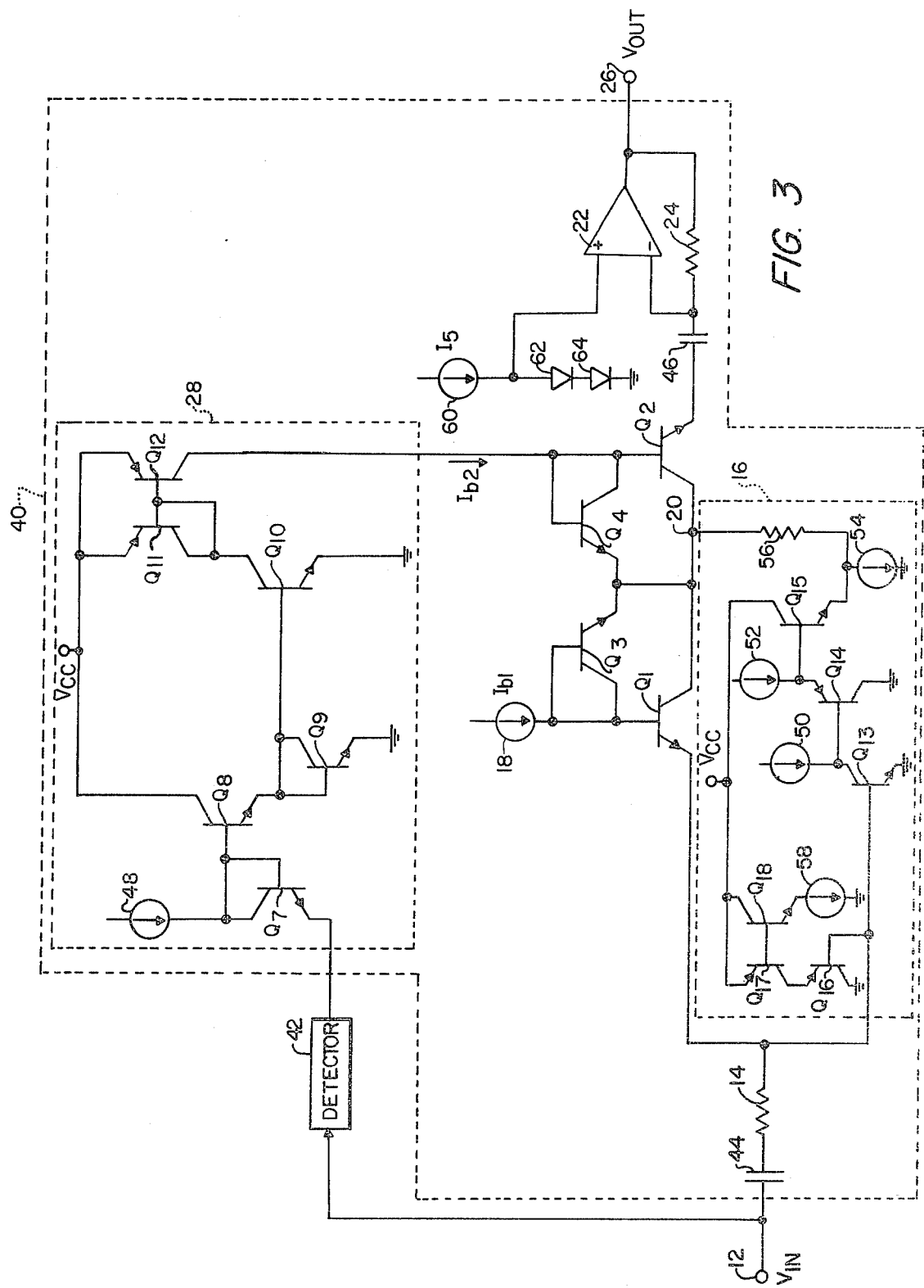
FIG. 3 is a detailed partial schematic, partial block diagram of the preferred embodiment of the signal gain controlled system of the present invention, useful as a signal expander (decoder)
Figure 5:
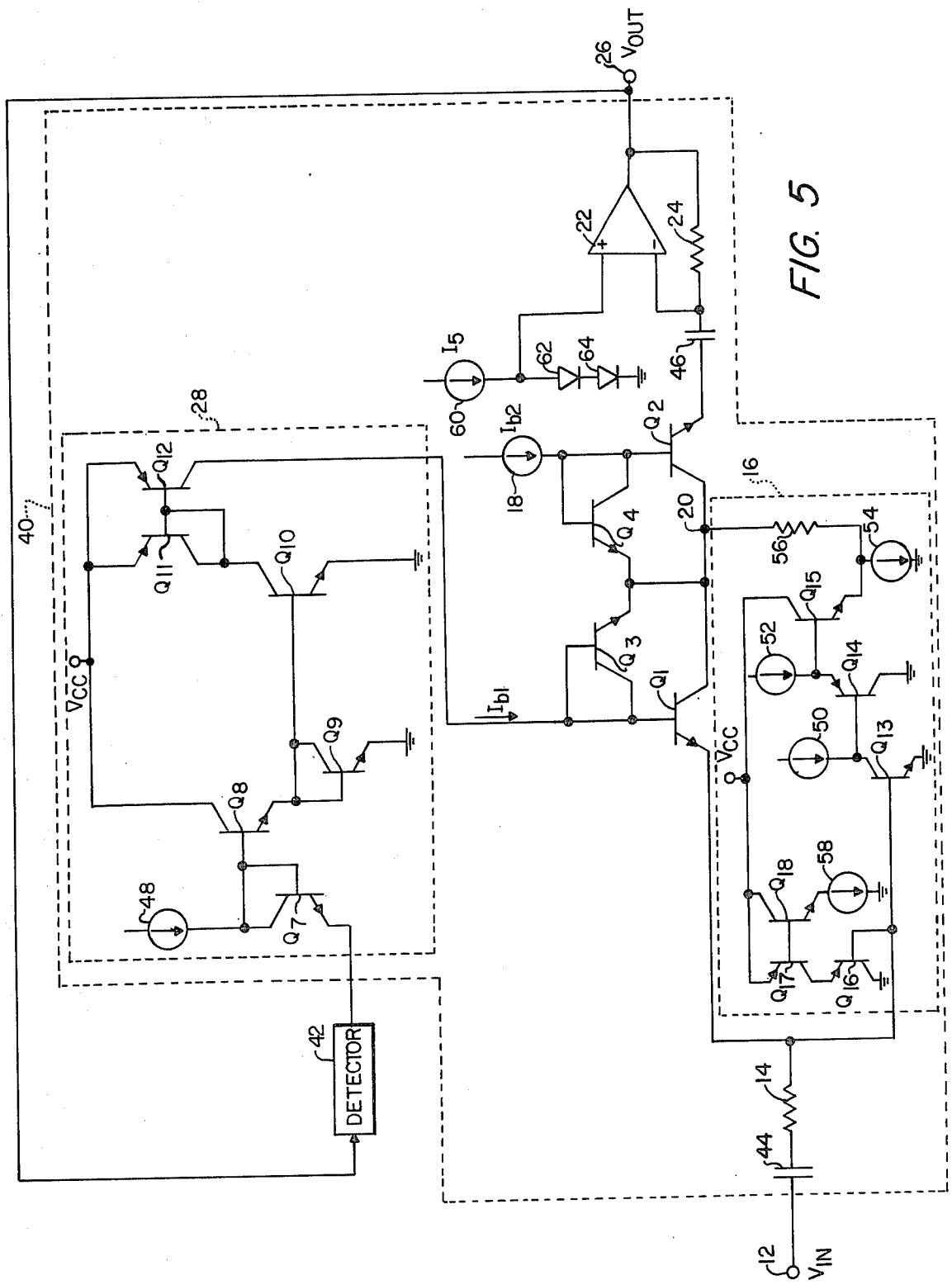
FIG. 5 is a detailed partial schematic, partial block diagram of the preferred embodiment of the signal gain controlled system of the present invention, useful as a signal compressor (encoder).

As will be more evident from the description of FIGS. 3 and 5, while the transistors $Q_1$ and $Q_2$ are shown in FIG. 1 with their emitters connected in common, the collector and emitter of each can be connected in an opposite sense so that transistors $Q_1$ and $Q_2$ are connected with common collectors. This can occur since the two modes of operation only vary with respect to $\beta_f$ and $\beta_r$ (defined below) which in the instant application do not dictate the theory of operation. It will now be shown that the current gain provided by the structure shown in FIG. 1 is a function of the ratio of the base currents $I_{b1}$ and $I_{b2}$. More specifically, the Ebers-Moll transistor model relate $I_b$ (the base current), $I_c$ (the collector current) and $V_{ce}$ (the collector to emitter voltage) as follows:

(1) $V_{ce} = V_t \cdot \ln[\beta_f/\beta_r)[I_c + (\beta_r+1)I_b]/]\beta_f I_b - I_c]]$ wherein $V_t$ is the thermal voltage equal to $kT/q$ (where K and q are constants, and T is the operating temperature);

ln is the natural logarithmic function;

$\beta_f$ is the large-signal forward-injection common-emitter short-circuit current gain; and $\beta_r$ is the large-signal reverse-injection common-emitter short-circuit current gain.

Referring to FIG. 1, since transistors $Q_1$ and $Q_2$ are of identical structure the respective values of $\beta_f$ and $\beta_r$ of the transistors will theoretically be the same.

Assuming that no offset voltage differences exist between the input terminals of amplifiers 16 and 22; the collector to emitter voltages of the two transistors will be identical, and thus:

(2) $V_{ce1} = V_{ce2}$;

wherein $V_{ce1}$ is the collector to emitter voltage of transistor $Q_1$; and $V_{ce2}$ is the collector to emitter voltage of transistor $Q_2$.

Referring again to equation (1), the relationship between the collector current $I_{c1}$, of transistor $Q_1$ and the collector current $I_{c2}$ of transistor $Q_2$ can be derived as follows:

$$\frac{\beta_f[I_{c1} + (\beta_r + 1)I_{b1}]}{\beta_r[\beta_f I_{b1} - I_{c1}]} = \frac{\beta_f[I_{c2} + (\beta_r + 1)I_{b2}]}{\beta[\beta_f I_{b2} - I_{c2}]} \quad (3)$$

Equation (3) reduces to $[I_{c1} = (\beta_r+1)I_{b1}][\beta_f I_{b2} - I_{c2}] = [I_2 + (\beta_r+1)I_{b2}][\beta_f I_{b1} - I_{c1}]$ Equation (4) will reduce to (5) $I_{c2} = (I_{b2}/I_{b1})I_{c1}$, or (6) $I_{c2}/I_{c1} = I_{b2}/I_{b1}$ TI Since $I_{in} = I_{c1}$, and $I_{out} = I_{c2}$ (7) $I_{out} = I_{in}(I_{b2}/I_{b1})$ Thus, if the two amplifiers 16 and 22 have identical input offset voltages, the collector-emitter voltages $V_{ce}$ of each transistor $Q_1$ and $Q_2$ will be equal, and the current gain of the system provided by the transistors is equal to the ratio of the two base currents $I_{b2}$ and $I_{b1}$.

The ratio can easily be set for example, by a differential pair of transistors, or alternatively, in a manner as will be evident from the description of FIGS. 3 and 5. While equation (6) defines a current gain, it will be evident that the overall system gain can be expressed as a voltage gain since the input current $I_{c1}$ is derived from the input voltage, which is converted to a current because of the input resistor 14. Similarly, the output current $I_{c2}$ is converted to the output voltage by output resistor 24.

Referring to FIG. 3, the system of the present is shown as a preferred embodiment for use in performing expansion (decoding) in a noise reduction scheme. The system includes the gain cell generally indicated as 40 and a signal level detector 42.

Gain cell 40 includes the system elements of FIG. 1. In addition to input terminal 12, resistors 14 and 24, operational amplifiers 16 and 22 and transistors $Q_1$ and $Q_2$, the cell 40 includes means for minimizing the effects of any offset voltages between the inputs of amplifiers 16 and 22 so that the collector to emitter voltages $V_{ce}$ of transistors $Q_1$ and $Q_2$ will remain equal and the transistors will operate at their proper operating curves for particular values of $I_{b1}$ and $I_{b2}$. The design objective is met by making the bias point of the emitter currents of transistors $Q_1$ and $Q_2$ of FIG. 3 equal to zero. Since the transistors $Q_1$ and $Q_2$ are used in the reversed configuration from that shown in FIG. 1, this is equivalent to making $I_c$ in equation (1) equal to zero so that equation (1) reduces to (8) $V_{ce} = V_r \ln[(\beta_r + 1)/\beta_r]$;

wherein $\beta_r$ is actually the value of $\beta_f$.

Equation (8) therefore implies that $V_{ce}$ is independent of any value of $I_b$. Thus, the DC bias values of the collector-emitter voltages of transistor $Q_1$ and $Q_2$ will be substantially equal under all conditions of gain ($I_{b2}/I_{b1}$).

Preferably a blocking capacitor 44 is coupled between input terminal 12 and the inverting input of amplifier 16, in series with resistor 14, while capacitor 46 is coupled between the emitter of transistor $Q_2$ and the inverting input of amplifier 22. Capacitor 46 should be relatively large. For example, for audio signal transmission a capacitance value in the order of 100 microfarads is satisfactory where the value of $I_{b2}$ is in the range of 100 microamps.

To the extent that capacitor 46 behaves as a short circuit at frequencies of interest, transistors $Q_1$ and $Q_2$ will experience identical incremental changes in $V_{ce}$. Therefore, in this embodiment, the conditions posed by equation (2) will be substantially met. Alternatively, the operational amplifiers 16 and 22 can be trimmed in a manner well known in the art so that the offsets of the inputs of the amplifiers are equal. Other methods of equalizing the offsets are known in the art.

Theoretically, for ideal operation of the system the forward and reverse current gains, $\beta_f$ and $\beta_r$, of the transistors $Q_1$ and $Q_2$ must be independent of the collector currents. In other words, the curves of FIG. 2 each should be similar in a geometric sense (i.e., same shape, different scale) so that no distortion will occur. In practice, however, bipolar transistors do not exhibit this characteristic. Accordingly, in the preferred embodiment of FIG. 3, means are provided for making the $V_{ce}/I_c$ response curves more similar. Preferably, the means is in the form of at least one transistor for each transistor $Q_1$ and $Q_2$. The added transistors are of the same conductivity type as transistors $Q_1$ and $Q_2$. The added transistors are identical in structure to transistors $Q_1$ and $Q_2$, and connected in a diode mode so as to provide a parallel conductive path for the particular base current $I_b$.

Figure 4:
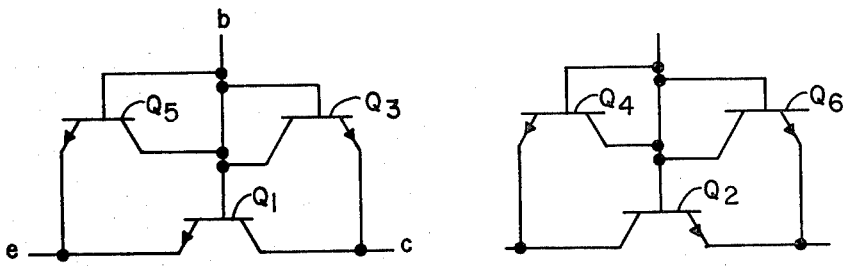
FIG. 4 illustrates a modification to the bipolar transistor used as a variable resistor in the present invention.

More specifically, as shown in FIG. 4, two transistors $Q_3$ and $Q_4$, both of the same conductivity type and each matched for its $V_{be}/I_c$ characteristics with that of transistors $Q_1$ and $Q_2$, are each connected in a diode-mode as indicated. Diode connection is provided by connecting the base and collector of transistor $Q_3$ together and to the base of transistor $Q_1$. Similarly, the base and collector of transistor $Q_4$ are connected together and to the base of transistor $Q_2$. Alternatively, or additionally, as shown in FIG. 4, additional transistors $Q_5$ and $Q_6$, identical in structure to transistors $Q_1$ and $Q_2$, can be used so as to provide alternative or additional parallel paths. Specifically, a parallel path can be provided by diode connecting transistor $Q_5$ between the base and collector of transistor $Q_1$, and diode connecting transistor $Q_6$ between the base and collector of transistor $Q_2$. In order to expand (decode) the input signal, source 18 (for providing the base current $I_{b1}$) is a reference current source, while the base current $I_{b2}$ is derived from the input signal at terminal 12.

More particularly, detector 42 has its input connected to sense the amplitude level of the input signal at terminal 12 and provide at its output a signal having a DC value as a function of the sensed amplitude level. Detector 42 is preferably of the type (such as the one described and claimed in U.S. Pat. No. 3,681,618 issued to David E. Blackmer on Aug. 1, 1972) which provides an output voltage signal as a logarithmic function of the RMS value of the sensed amplitude level of the input voltage signal at terminal 12, although other types of detectors such as peak and average detectors, which are well known can be utilized.

The output of detector 42 is connected to the emitter of transistor $Q_7$. The latter is diode-connected, having its base and collector connected together. The base and collector of transistor $Q_7$ are also connected to the current reference source 48 and to the base of transistor $Q_8$. The latter has its collector connected to the upper voltage rail which in turn is adapted to be powered by a voltage source $V_{cc}$. The emitter of transistor $Q_8$ is connected to the collector and base of transistor $Q_9$, the latter having its emitter connected to system ground. The emitter of transistor $Q_8$ is also connected to the base of transistor $Q_{10}$. The collector of transistor $Q_{10}$ is connected to the collector and base of PNP transistor $Q_{11}$ and to the base of PNP transistor $Q_{12}$. The emitters $Q_{11}$ and $Q_{12}$ are connected to the upper voltage rail. The collector of transistor $Q_{12}$ provides the current $I_{b2}$ to the base of transistor $Q_2$. $I_{b2}$ is thus a function of the control voltage output of detector 42, which in turn is a function of the voltage input Vin at input terminal 12. As a consequence the ratio of $I_{b2}/I_{b1}$ and therefore the current gain of system 40 is a function of the input signal. By utilizing detector 42 in the manner shown, the input voltage signal can be dynamically expanded.

In order to utilize the system for dynamically compressing or encoding the input voltage signal, as shown in FIG. 5, the current sources 18 and 28 are switched so that the reference current from 18 is applied to the base of transistor $Q_2$ and the current from the collector $Q_{12}$ is applied to the base of transistor $Q_1$. Additionally, the input of detector 42 is connected to the output terminal 26 so that detector 42 detects the output voltage. Thus, for compression, the current $I_{b1}$ is derived from the output signal and $I_{b2}$ from a reference source.

Finally, in order to operate the system of FIGS. 3 and 5 with a single power source, amplifier 16 is preferably designed and the noninverting input of amplifier 22 is connected as shown in those figures.

Specifically, the resistor 14 is connected to the bases of NPN transistor $Q_{13}$, the latter having its emitter connected to system ground and its collector connected to the reference current source 50 and to the base of PNP transistor $Q_{14}$. The collector of transistor $Q_{14}$ is connected to system ground, while its emitter is connected to reference current source 52 and the base of NPN transistor $Q_{15}$. Transistor $Q_{15}$ has its collector connected to the voltage source $V_{cc}$ and its emitter connected to reference current source 54 and through resistor 56 to the output of amplifier 16 at junction 20.

Means are also preferably provided for correcting for input bias current. Preferably, the means includes PNP transistor $Q_{16}$ having its base connected at the input of amplifier 16, its collector connected to system ground and its emitter connected to the collector of PNP transistor $Q_{17}$. The latter has its base and emitter respectively connected to the base and collector of NPN transistor $Q_{18}$. Transistor $Q_{18}$ has its collector connected to voltage source $V_{cc}$ and its emitter connected to reference current source 58.

The non-inverting input of amplifier 22 is connected to the reference source 60 and to the anode of diode 62. The cathode of diode 62 is connected to the anode of diode 64, which in turn has its cathode connected to system ground.

The reference currents provided by sources 18, 48, 50, 52, 54, 58 and 60 can easily be provided by transistors which are suitably coupled to $V_{cc}$ or ground to provide the necessary current levels so that a single voltage source, $V_{cc}$, can be used to power the system. An example of the current levels required are as follows: Source 18=10 microamps, source 48=7.5 microamps, source 50=3.5 microamps, source 52=15 microamps, source 54=150 microamps, source 58=3.5 microamps, and source 60 approximately 50 microamps.

The system shown can be easily manufactured in IC form since transistors $Q_1$, $Q_2$, $Q_3$ and $Q_4$ (as well as transistors $Q_5$ and $Q_6$, when used) are all NPN transistors. The value of $V_{cc}$, the only power source required, can drop as low as 1.6 volts DC at room temperature and the system still operate effectively. The device is bipolar since it will operate for both positive and negative input voltage signals.

Certain changes may be made in the apparatus shown without departing from the scope of the present invention. For example, while the transistors $Q_1$, $Q_2$, $Q_3$, $Q_4$, $Q_5$ and $Q_6$, are preferably each of an NPN conductivity type, an operative embodiment can also be achieved by utilizing PNP type transistors. Further, while the source 18 is shown as a reference source in FIGS. 3 and 5, the signal provided in FIG. 3 from source 18 can actually be derived from the input voltage at terminal 12, while the signal provided in FIG. 5 from source 18 can be derived from the output voltage at terminal 26. In this manner, both control signals are derived from and are a function of the input signal in FIG. 3, and are a function of the output signal in FIG. 5. In such a configuration the gain would still vary as a function of the ratio of $I_{b2}/I_{b1}$, with both currents $I_{b1}$ and $I_{b2}$ varying with the respective input and output voltages.

It has also been found that reversing the current inputs to the bases of transistors $Q_1$ and $Q_2$ in FIG. 3, so that the output current from source 18 is fed into the base of transistor $Q_2$, and the current provided from the collector of transistor $Q_{12}$ is fed into the base of transistor $Q_1$ will result in a compressor providing substantially infinite compression.

Since certain changes may be made in the above apparatus without departing from the scope of the invention herein involved, it is intended that all matters contained in the accompanying drawings shall be interpreted in an illustrative and not in a limiting sense.

What is claimed is:

1. A device for impressing a gain on an input signal as a function of a gain control signal, said device comprising, in combination:
   a device input terminal;
   an operational amplifier including an amplifier input terminal and an amplifier output terminal;
   first and second impedance means, said first impedance means being coupled between said device input terminal and said amplifier input terminal so as to provide an input impedance to said amplifier, said second impedance means being coupled between said amplifier input terminal and said amplifier output terminal so as to provide feed back impedance to said amplifier, at least one of said first and second impedance means including a bipolar transistor having (1) its emitter and collector coupled to the corresponding ones of said terminals so as to provide a resistance therebetween, and (2) its base connected to receive said control signal; and
   means for applying a biasing signal to said bipolar transistor so that (a) said transistor operates in its saturated region, (b) said transistor functions as a variable resistor between its collector and emitter and (c) said gain varies as a function of said control signal.

2. A device according to claim 1, wherein said transistor is of an NPN conductivity type.

3. A device according to claim 1, wherein said gain control signal is a fixed reference signal.

4. A device according to claim 1, wherein said gain control signal is a variable signal.

5. A device according to claim 4, wherein said gain control signal is a function of the input signal at said device input terminal.

6. A device according to claim 4, further including a device output terminal coupled to said amplifier output terminal, wherein said gain control signal is a function of the output signal at said device output terminal.

7. A device according to claim 1, wherein said gain control signal is a current signal.

8. A device according to claim 1, wherein said first impedance means includes said transistor.

9. A device according to claim 1, wherein said second impedance means includes said transistor.

10. A signal gain controlled system for impressing a gain on an input signal, said system being of the type including a system input terminal for receiving an input signal and a system output terminal for providing an output signal, said system comprising in combination:
    an amplifier including an amplifier input terminal coupled to said system input terminal and an amplifier output terminal;
    a feedback path coupled between said amplifier input terminal and said amplifier output terminal, said feedback path including first impedance means for providing a feedback resistance to said amplifier as a function of a first control signal; and
    a signal path coupled between said amplifier output terminal and said system ouptut terminal, said signal path including second impedance means for providing a resistance as a function of a second control signal;
    wherein said first and second impedance means are each variable impedance means having a conductance value as a substantially linear function of the respective one of said first and second control signals and said gain is a function of the ratio of said second control signal to said first control signal.

11. A system according to claim 10, wherein said impedance means each includes a transistor having its base coupled to receive the respective one of said first and second control signals, said system further including means for biasing said transistors so that each of said transistors operates in its saturated region.

12. A system according to claim 11, wherein the transistors of said first and second impedance means are of the same conductivity type and have identical structures.

13. A system according to claim 12, further including means for maintaining the collector-to-emitter voltages of said transistors of said first and second impedance means equal.

14. A system according to claim 10, wherein said first impedance means includes a first transistor having its collector and emitter connected in said feedback path and its base connected to receive said first control signal, and said second impedance means includes a second transistor having its collector and emitter connected in said signal path and its base connected to receive said second control signal, said system further comprising means for biasing said transistors so that each of said transistors operates in its saturated region.

15. A system according to claim 14, wherein said transistors are of the same conductivity type and have identical structures.

16. A system according to claim 15, wherein said system further includes means for generating one of said control signals as a function of a reference value, and means for generating the other of said control signals as a function of one of said input and output signals.

17. A system according to claim 16, wherein said means for generating the other of said control signals includes sensing means for sensing the level of said input signal and for generating a third signal as a function of said level and means responsive to said third signal for generating said other control signal.

18. A system according to claim 17, wherein said sensing means generates said third signal as a function of the RMS value of the level of said input signal.

19. A system according to claim 16, further including a second amplifier including second amplifier input and output terminals connected in said signal path between said second impedance means and said system output terminal.

20. A system according to claim 19, further including a first resistance element coupled between said system input terminal and the first amplifier input terminal, and a second resistive element coupled between said second amplifier input and output terminals.

21. A system according to claim 19, further including means for reducing the effects of any offset signal level differential between said first and second amplifiers.

22. A system according to claim 21, wherein said means for reducing the effects said offset includes a capacitive element coupled to the input terminal of each said amplifiers.

23. A system according to claim 22, further including a pair of diode elements associated with each of said transistors, one of said pair being connected between the base of each transistor and its respective collector, and the other of said pair being connected between the base of each transistor and its respective emitter.

24. A system according to claim 23, wherein each of said diode elements is a transistor having $V_{be}/I_c$ characteristics matched to those of said first and second transistors.

25. A system according to claim 15, further including diode means connected between the base of the respective transistor and one of said collector and emitter of that transistor.

26. A system according to claim 25, wherein each of said diode means includes a third transistor connected in a diode mode and matched for its $V_{be}/I_c$ characteristics with said first and second transistors.

27. A signal gain controlled system for imprssing a system signal gain on an input signal, said system being of the type including input means for receiving the input signal and output means for providing the output signal responsively to said input signal, said system comprising in combination:

means for generating a first control signal;
means responsive to said input signal and said first control signal and including a first transistor for generating an intermediate signal;
means for generating a second control signal;
means responsive to said intermediate signal and said second control signal and including a second transistor for generating said output signal; and
means for applying a biasing signal to each of said first and second transistors so that said transistors each operates in its saturated region;
wherein said system signal gain is a function of the ratio of said second control signal to said first control signal.

28. A system according to claim 27, wherein said means for generating an intermediate signal is responsive to the input current of said input signal and said intermediate signal is a voltage signal, and said means for generating said output signal generates an output current.

29. A system according to claim 28, wherein said first and second control signals are each current signals.

30. A system according to claim 29, wherein said system signal gain is a function of the output current over the input current and is substantially equal to the magnitude of the second control signal current divided by the magnitude of the first control signal current.

31. A system according to claim 27, wherein the collector and base currents of said first transistor are respectively functions of the input current of said input signal and the magnitude of the current of said first control signal, and said intermediate signal is a voltage, said voltage being a function of the collector-to-emitter voltage of said first transistor, and the collector-to-emitter voltage and base current of said second transistor are respectively functions of said intermediate voltage and the magnitude of the current level of said second control signal, and said output signal is a function of said collector current of said second transistor.

32. A system according to claim 31, wherein said first and second transistors are configured so that the collector-to-emitter voltage of said first transistor is substantially equal to the collector-to-emitter voltage of said second transistor.

33. A system according to claim 27, wherein the emitter and base currents of said first transistor are respectively functions of the input current of said input signal and the magnitude of the current of said first control signal, and said intermediate signal is a voltage, said voltage being a function of the collector-to-emitter voltage of said first transistor, and the collector-to-emitter voltage and base current of said second transistor being respectively functions of said intermediate voltage and the magnitude of the current level of said second control signal, and said output signal is a function of said emitter current of said second transistor.

34. A system according to claim 33, wherein said first and second transistors are configured so that the collector-to-emitter voltage of said first transistor is substantially equal to the collect-to-emitter voltage of said second transistor.

35. A variable signal gain controlled system for impressing a system signal gain on an input signal in response to a detected signal so as to vary the dynamic range of said input signal as a function of said detected signal, said system being of the type including input means for receiving the input signal and output means for providing the output signal responsively to said input signal, said system comprising, in combination:

means for generating a first control signal;

means responsive to said input signal and said first control signal and including a first transistor for generating an intermediate signal;

means for generating a second control signal;

means responsive to said intermediate signal and said second control signal and including a second transistor for generating said output signal; and means for applying a biasing signal to each of said first and second transistors so that each of said transistors operates in its saturated region;

wherein at least one of said means for generating a control signal is responsive to and a function of said detected signal and said detected signal is derived from one of said input and output voltage signals, and said system signal gain is a function of the ratio of said second control signal to said first control signal.

36. A system according to claim 35, wherein the other of said means for generating a control signal is capable of generating a reference signal.

37. A system according to claim 36, wherein said means for generating said first control signal is responsive to said detected signal, and said detected signal is derived from said output voltage signal, and said means for generating said second control signal generates a reference signal so that said system provides signal compression.

38. A system according to claim 36, wherein said means for generating said second control signal is responsive to said detected signal, and said detected signal is derived from said input voltage signal, and said means for generating said first control signal generates a reference signal so that said system provides signal expansion.

* * * * *

UNITED STATES PATENT AND TRADEMARK OFFICE
CERTIFICATE OF CORRECTION

PATENT NO. : 4,471,324
DATED : September 11, 1984
INVENTOR(S) : David R. Welland It is certified that error appears in the above-identified patent and that said Letters Patent is hereby corrected as shown below:

Claim 10, column 10, line 44, "ouptut" should be -- output --;

Claim 22, column 11, line 42, "of" should be inserted before "said";

Claim 22, column 11, line 43, "capactive" should be -- capacitive --;

Claim 27, column 11, line 63, "imprssing" should be -- impressing --; and

Claim 34, column 12, line 61, "collect" should be -- collector --.

Signed and Sealed this

Fifth Day of February 1985

[SEAL]

Attest:

DONALD J. QUIGG

Attesting Officer  Acting Commissioner of Patents and Trademarks